United States Patent
Matsumura

(10) Patent No.: US 6,730,455 B2
(45) Date of Patent: May 4, 2004

(54) METHOD OF PREPARING PLANOGRAPHIC PRINTING PLATE

(75) Inventor: Toshiyuki Matsumura, Fujimo-machi (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/215,673

(22) Filed: Aug. 8, 2002

(65) Prior Publication Data

US 2003/0113667 A1 Jun. 19, 2003

(30) Foreign Application Priority Data

Aug. 28, 2001 (JP) ........................................ 2001-257727

(51) Int. Cl.$^7$ ................................................. G03F 7/30
(52) U.S. Cl. .................................................... 430/270.1
(58) Field of Search ....................................... 430/270.1

(56) References Cited

U.S. PATENT DOCUMENTS 5,800,965 A * 9/1998 Tsuji et al. ............... 430/287.1
5,998,095 A * 12/1999 Nagase ..................... 430/273.1
6,103,087 A * 8/2000 Mori ............................ 205/214

FOREIGN PATENT DOCUMENTS

EP         0 738 929      * 10/1996

* cited by examiner

*Primary Examiner*—Hoa Van Le
(74) *Attorney, Agent, or Firm*—Squire Sanders & Dempsey, LLP

(57) ABSTRACT

A planographic printing plate manufacturing method is disclosed which comprises the step of developing a presensitized planographic printing plate with a developer with a pH of from 11.5 to less than 12.5 which does not substantially contain an organic solvent, wherein the presensitized planographic printing plate comprises a support having a roughened hydrophilic surface with a center line average surface roughness Ra of from 0.5 to 0.8 μm, and provided thereon, a photopolymerizable light sensitive layer and an oxygen shielding layer in that order, the photopolymerizable light sensitive layer containing A) an addition polymerizable monomer having an ethylenic double bond, B) a photopolymerization initiator, C) a sensitizing dye, and D) a polymer binder, and the oxygen shielding layer containing E) polyvinyl alcohol and F) polyvinyl pyrrolidone.

10 Claims, No Drawings

METHOD OF PREPARING PLANOGRAPHIC PRINTING PLATE

FIELD OF THE INVENTION

The present invention relates to a method of preparing a planographic printing plate, the method comprising the step of developing a presensitized planographic printing plate comprising a photopolymerizable light sensitive layer with a liquid developer to form a negative image on the planographic printing plate.

BACKGROUND OF THE INVENTION

It is generally known that a protective layer (oxygen shielding layer) is provided on a light sensitive layer of a photopolymerizable light sensitive material in order to prevent oxygen from inhibiting polymerization. As a method for providing the oxygen shielding layer, there is a method in which an aqueous solution of a water soluble polymer such as polyvinyl alcohol or polyvinyl pyrrolidone is coated on a light sensitive layer and dried to form a water soluble polymer layer. The water soluble polymer provides an excellent oxygen shielding ability, coatability and solubility to a developer used. However, a planographic printing plate, which is prepared by developing a presensitized planographic printing plate employing the water soluble polymer, has the problem that printing durability as well as ink receptivity are poor.

Use of a developer containing an organic solvent improves the ink receptivity, but results in a new problem such as malorder attributed to the organic solvent or deterioration of working environment.

An increase of pH of the developer makes it possible to eliminate the organic solvent from the developer without lowering developability or ink receptivity, but it has been found that the pH increase of the developer has an adverse effect on printing durability, when printing is carried out employing a specific ink, particularly soybean oil-based ink.

SUMMARY OF THE INVENTION

An object of the invention is to provide a method of developing a presensitized planographic printing plate with high sensitivity and high storage stability, employing a developer, which neither produces malodor nor lowers working environment, to obtain a planographic printing plate with high ink receptivity and high printing durability, wherein the presensitized planographic printing plate comprises a photopolymerizable light sensitive layer and provided thereon, an oxygen shielding layer containing polyvinyl alcohol and polyvinyl pyrrolidone which is firmly adhered to the light sensitive layer with good adhesion.

DETAILED EXPLANATION OF THE INVENTION

The above objects of the invention can be attained by the followings:

1. A method of manufacturing a planographic printing plate, the method comprising the step of developing a presensitized planographic printing plate with a developer with a pH of from 11.5 to less than 12.5, which does not substantially contain an organic solvent, wherein the presensitized planographic printing plate comprises a support having a roughened hydrophilic surface with a center line average surface roughness Ra of from 0.5 to 0.8 μm, and provided thereon, a photopolymerizable light sensitive layer and an oxygen shielding layer in that order, the photopolymerizable light sensitive layer containing A) an addition polymerizable monomer having an ethylenic double bond, B) a photopolymerization initiator, C) a sensitizing dye, and D) a polymer binder, and the oxygen shielding layer containing E) polyvinyl alcohol and F) polyvinyl pyrrolidone.
2. the method of item 1, wherein the developer is a developer containing no organic solvent or a developer containing an organic solvent in an amount of not more than 2% by weight.
3. the method of item 1, wherein the presensitized planographic printing plate comprises a subbing layer containing a compound having a polyalkoxysilyl group between the support and the photopolymerizable light sensitive layer.
4. the method of item 3, wherein the compound having a polyalkoxysilyl group is a silane coupling agent having a (meth)acryloyl group.
5. the method of item 1, wherein the addition polymerizable monomer having an ethylenic double bond further has a phosphate bond in the molecule.
6. the method of item 1, wherein the photopolymerization initiator is a titanocene compound.
7. the method of item 1, wherein the sensitizing dye is a pyromethene dye.
8. the method of item 1, wherein the polymer binder is a reaction product of a vinyl copolymer having a carboxyl group in the molecule with a compound having a (meth)acryloyl group and an epoxy group in the molecule.
9. the method of item 1, wherein the polymer binder has an acid value of from 10 to 150.
10. the method of item 1, wherein the planographic printing plate is a printing plate used when printing is carried out employing soybean oil-based ink.
11. a method of manufacturing a planographic printing plate, the method comprising the step of developing a presensitized planographic printing plate with a developer with a pH of not less than 11.5 which does not substantially contain an organic solvent, wherein the presensitized planographic printing plate comprises a support having a roughened hydrophilic surface with a center line average surface roughness Ra of from 0.5 to 0.8 μm, and provided thereon, a photopolymerizable light sensitive layer and an oxygen shielding layer in that order, the photopolymerizable light sensitive layer containing A) an addition polymerizable monomer having an ethylenic double bond, B) a photopolymerization initiator, C) a sensitizing dye, and D) a polymer binder, and the oxygen shielding layer containing E) polyvinyl alcohol and F) polyvinyl pyrrolidone.
12. the method of item 11 above, wherein the pH of the developer is in the range of from 11.5 to less than 12.5.
13. the method of item 11 or 12 above, wherein a subbing layer containing a compound having a polyalkoxysilyl group is provided between the support and the photopolymerizable light sensitive layer.
14. the method of item 13 above, wherein the compound having a polyalkoxysilyl group is a silane coupling agent having a (meth)acryloyl group.
15. the method of any one of items 11 through 14 above, wherein the addition polymerizable monomer having an ethylenic double bond further has a phosphoric acid ester bond in the molecule.

16. the method of any one of items 11 through 15 above, wherein the photopolymerization initiator is a titanocene compound.
17. the method of any one of items 11 through 16 above, wherein the sensitizing dye is a pyrromethene dye.
18. the method of any one of items 11 through 17 above, wherein the polymer binder is a reaction product of a vinyl copolymer having a carboxyl group in the molecule with a compound having a (meth)acryloyl group and an epoxy group in the molecule.

It has been found that a planographic printing plate manufacturing method provides a planographic printing plate with high printing durability even when soybean oil-based ink is employed as a printing ink, the method comprising the step of developing a presensitized planographic printing plate with a developer with a pH of from 11.5 to less than 12.5 which does not substantially contain an organic compound, wherein the presensitized planographic printing plate comprises a support having a roughened surface with a center line average surface roughness Ra (according to JIS B 0601) of from 0.5 to 0.8 $\mu$m, and provided thereon, a light sensitive layer and an oxygen shielding layer containing polyvinyl alcohol and polyvinyl pyrrolidone in that order. In the invention, the center line average surface roughness Ra is measured employing a method as described in JIS B 0601.

The invention will be detailed below.

<Support>

The presensitized planographic printing plate of the invention comprises a support having a hydrophilic surface, which is surface roughened to have a center line average surface roughness of from 0.5 to 0.8 $\mu$m. As a support, a plate of aluminum, stainless steel, chromium, or nickel can be used. Among them, an aluminum plate is preferably used, which may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening. The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and oxidized films which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support.

The surface roughening methods include a mechanical surface roughening method and an electrolytic surface roughening method electrolytically etching the support surface. Though there is no restriction for the mechanical surface roughening method, a brushing roughening method and a honing roughening method are preferable.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 g/m$^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method in which the support is electrolytically surface roughened in an acidic electrolytic solution. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 A/dm$^2$, and is preferably from 50 to 150 A/dm$^2$. The quantity of electricity can be selected from the range of from 100 to 5000 C/dm$^2$, and is preferably 100 to 2000 C/dm$^2$. The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 A/dm$^2$, and is preferably from 20 to 150 A/dm$^2$. The quantity of electricity can be selected from the range of from 100 to 5000 C/dm$^2$, and is preferably 100 to 2000 C/dm$^2$. The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 A/dm$^2$, and is preferably from 50 to 150 A/dm$^2$. The quantity of electricity can be selected from the range of from 10 to 5000 C/dm$^2$, and is preferably 100 to 2000 C/dm$^2$. The temperature during the electrolytically surface roughening may be in the range of from 10 to 50° C., and is preferably from 15 to 45° C. The hydrochloric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m². After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 A/dm² to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 mg/dm², and preferably 10 to 40 mg/dm². The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye, an amine salt; and so on. The sol-gel treatment support, which has a functional group capable of causing addition reaction by radicals as a covalent bond, is suitably used.

In the invention, an aluminum plate, which has been subjected to surface roughening, subjected to anodizing treatment, subjected to sealing treatment, and then subjected to undercoating treatment, is especially preferred.

<Subbing Layer>

In the presensitized planographic printing plate of the invention, a subbing layer is preferably provided on a support in order to improve adhesion between the support and the photopolymerizable light sensitive layer. A compound used in the subbing layer is preferably a compound having a polyalkoxy silyl group. The compound having a polyalkoxy silyl group is preferably a silane coupling agent having a (meth)acryloyl group. Examples thereof include γ-methacryloxypropyltrimethoxysilane.

<Photopolymerizable Light Sensitive Layer>

The support in the invention is prepared employing the method as described above to have a roughened hydrophilic surface with a center line average surface roughness Ra of from 0.5 to 0.8 μm. A photopolymerizable light sensitive layer is provided on the resulting support, which contains A) an addition polymerizable ethylenic double bond-containing monomer, B) a photopolymerization initiator, C) a sensitizing dye, and D) a polymer binder.

A) Addition Polymerizable Ethylenic Double Bond-containing Monomer

As the addition polymerizable ethylenic double bond-containing monomer in the invention, known monomers can be used. Examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryloxyethyl acrylate, tetrahydrofurfuryloxyhexanorideacrylate, an ester of 1,3-dioxane-ϵ-caprolactone adduct with acrylic acid or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ϵ-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ϵ-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ϵ-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a polymethacrylate, polyitaconate, polycrotonate or polymaleate alternative of the above polyacrylate; and an oligomer of these esters.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol, an epoxyacrylate such as bisphenol A·epichlorhydrin·(meth)acrylic acid or phenol novolak·epichlorhydrin·(meth)acrylic acid obtained by incorporating (meth)acrylic acid in an epoxy resin, an urethaneacrylate such as ethylene glycol·adipic acid·tolylenediisocyanate·2-hydroxyethylacrylate, polyethylene glycol·tolylenediisocyanate·2-hydroxyethylacrylate, hydroxyethylphthalylmethacrylate·xylenediisocyanate, 1,2-polybutadieneglycol·tolylenediisocyanate·2-hydroxyethylacrylate or trimethylolpropane·propylene glycol·tolylenediisocyanate·2-hydroxyethylacrylate, obtained by incorporating (meth)acrylic acid in an urethane resin, a silicone acrylate such as polysiloxane acrylate, polysiloxane·diisocyanate·2-hydroxyethylacrylate, and an alkyd modified acrylate obtained by incorporating a methacroyl group in an oil modified alkyd resin and a spiran resin acrylate.

The light sensitive layer in the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The monomer used in the invention is preferably a phosphate compound having at least one ethylenic double bond. The phosphate compound is a compound with an ethylenic double bond in which at least one hydroxyl group of phosphoric acid is esterified, and is preferably a compound having a (meth)acryloyl group. Examples of the phosphate compound include Light Ester P-1M, Light Ester P-2M, Light Ester HOP-PM, Light Acrylate-P-1A and Light Acrylate-P-2A each produced by Kyoeisha Kagaku Co., Ltd.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV·EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

The light sensitive layer in the invention contains the monomer described above in an amount of preferably 1.0 to 80.0% by weight, and more preferably 3.0 to 70.0% by weight.

B) Photopolymerization Initiator

The light sensitive layer of the presensitized planographic printing plate of the invention contains a polymerization initiator.

The photopolymerization initiators include carbonyl compounds, organic sulfur compounds, peroxides, redox compounds, azo or diazo compounds, halides and photoreducing dyes disclosed in J. Kosar, "Light Sensitive Systems", Paragraph 5. The examples thereof are disclosed in British Patent No. 1,459,563.

Examples of the photopolymerization initiator will be shown below.

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis(dimethylamino)benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85–277 (1988) and Japanese Patent O.P.I. Publication No. 2-182701; 2,4,5-triarylimidazol dimmer disclosed in Japanese Patent O.P.I. Publication No. 3-209477; carbon tetrabromide; and organic halide compounds disclosed in Japanese Patent O.P.I. Publication No. 59-107344.

Among these compounds, titanocenes are preferred. Examples of the titanocenes include di-cyclopentadienyl-Ti-dichloride, dicyclopentadienyl-Ti-bisphenyl, dicyclopentadienyl-Ti-bis-2,3,4,5,6-pentafluorophenyl, dicyclopentadienyl-Ti-bis-2,3,5,6-tetrafluorophenyl, dicyclopentadienyl-Ti-bis-2,4,6-trifluorophenyl, dicyclopentadienyl-Ti-bis-2,6-difluorophenyl, dicyclopentadienyl-Ti-bis-2,4-difluorophenyl, di-methylcyclopentadienyl-Ti-bis-2,3,4,5,6-pentafluorophenyl, di-methylcyclopentadienyl-Ti-bis-2,3,5,6-tetrafluorophenyl, di-methylcyclopentadienyl-Ti-bis-2,4-difluorophenyl, and bis (cyclopentadienyl)-bis(2,6-difluoro-3-(pyriyl)phenyl)titanium (IRUGACURE 784, produced by Ciba Specialty Co., Ltd.), but are not limited thereto.

C) Sensitizing Dye

The light sensitive layer of the presensitized planographic printing plate of the invention contains a sensitizing dye.

Sensitizing dyes, which can induce sensitivity to the wavelengths of the visible and near infrared regions, include cyanines, phthalocyanines, merocyanines, porphyrins, spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, and compounds disclosed in European Patent No. 568,993, U.S. Pat. Nos. 4,508,811 and 5,227,227, and Japanese Patent O.P.I. Publication Nos. 2001-125255 and 11-271969.

Of these sensitizing dyes, pyrromethene dyes are preferred, and examples thereof include those disclosed in Japanese Patent O.P.I. Publication No. 11-271969. Examples of the pyrromethene dyes also include the compounds represented by the following formulae:

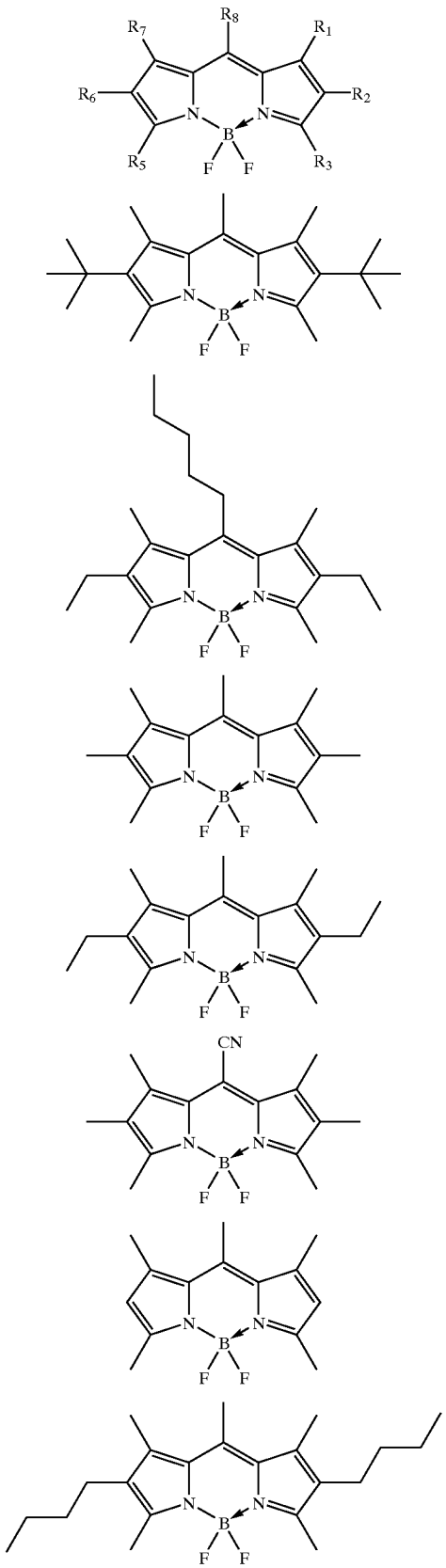

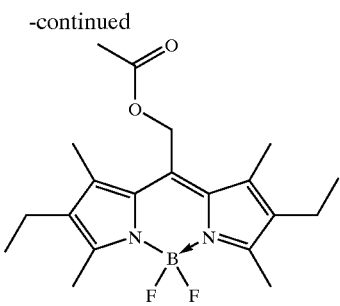

The addition amount of the photopolymerization initiator is not specifically limited, but is preferably 0.1 to 20 parts by weight based on 100 parts by weight of the addition polymerizable compound. The content ratio by mole of the photopolymerization initiator to the sensitizing dye in the light sensitive layer is 1:100 to 100:1.

D) Polymer Binder

The presensitized planographic printing plate of the invention comprises a polymer binder in the photopolymerizable light sensitive layer.

As the polymer binder can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

As the polymer binder, a vinyl copolymer obtained by copolymerization of an acryl monomer is preferred. The copolymer is preferably a copolymer of (a) a carboxyl group-containing monomer, or (b) alkyl methacrylate or alkyl acrylate with another monomer.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14).

(1) A monomer having an aromatic hydroxy group, for example, o-, (p- or m-)hydroxystyrene, or o-, (p- or m-)hydroxyphenylacrylate.

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, hydroxyethylvinyl ether, (3) A monomer having an aminosulfonyl group, for example, m- or p-aminosulfonylphenyl methacrylate, m- or p-aminosulfonylphenyl acrylate, N-(p-aminosulfonylphenyl)methacrylamide, N-(p-aminosulfonylphenyl)acrylamide, (4) A monomer having a sulfonamido group, for example, N-(p-toluenesulfonyl)acrylamide, N-(p-toluenesulfonyl)methacrylamide, (5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, N-4-hydroxyphenylmethacrylamide, (6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, N-butyl-N-(2-acryloxyethyl) heptadecafluorooctylsulfonamide, (7) A vinyl ether, for example, ethyl vinyl ether, 2-chloroethyl vinyl ether, propyl vinyl ether, butyl vinyl ether, octyl vinyl ether, phenyl vinyl ether, (8) A vinyl ester, for example, vinyl acetate, vinyl chroloacetate, vinyl butyrate, vinyl benzoate, (9) A styrene, for example, styrene, methylstyrene, chloromethystyrene,

(10) A vinyl ketone, for example, methyl vinyl ketone, ethyl vinyl ketone, propyl vinyl ketone, phenyl vinyl ketone,

(11) An olefin, for example, ethylene, propylene, isobutylene, butadiene, isoprene, 0086]

(12) N-vinylpyrrolidone, N-vinylcarbazole, N-vinylpyridine,

(13) A monomer having a cyano group, for example, acrylonitrile, methacrylonitrile, 2-pentenenitrile, 2-methyl-3-butene nitrile, 2-cyanoethyl acrylate, o-, m- or p-cyanostyrene,

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, N,N-diethylacrylamide, Further another monomer may be copolymerized with the above monomer. As the polymer binder is also preferred an unsaturated bond-containing copolymer which is obtained by reacting a carboxyl group contained in the above vinyl copolymer molecule with for example, a compound having a (meth)acryloyl group and an epoxy group.

Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication Nos. 11-27196.

The weight average molecular weight of the above copolymer is preferably 10,000 to 200,000 measured by gel permeation chromatography (GPC), but is not limited thereto.

The content of the polymer binder in the light sensitive layer is preferably from 10 to 90% by weight, more preferably from 15 to 70% by weight, and still preferably from 20 to 50% by weight in view of sensitivity.

The acid value of the polymer binder is preferably from 10 to 150, more preferably from 30 to 120, and still preferably from 50 to 90, in view of balance of polarity of the light sensitive layer, which can prevent coagulation of pigment used in the light sensitive layer coating liquid.

The thickness of the light sensitive layer is preferably 0.5 to 4 $g/m^2$, and more preferably 1 to 3 $g/m^2$.

<Oxygen Shielding Layer>

The presensitized planographic printing plate of the invention comprises a photopolymerizable light sensitive layer and an oxygen shielding layer containing polyvinyl alcohol and polyvinyl pyrrolidone provided on the photopolymerizable light sensitive layer. Polyvinyl alcohol has the effect of preventing oxygen from transmitting and polyvinyl pyrrolidone has the effect of increasing adhesion between the oxygen shielding layer and the light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the presensitized planographic printing plate of the invention, adhesive strength between the oxygen shielding layer and the light sensitive layer is preferably not less than 35 g/10 mm, more preferably not less than 50 g/10 mm, and still preferably not less than 75 g/10 mm.

The adhesive strength in the invention can be measured according to the following procedure.

When an adhesive tape with sufficient adhesive strength having a predetermined width is adhered onto the oxygen shielding layer, and then peeled at an angle of 90° to the plane of the presensitized planographic printing plate, strength necessary to peel the oxygen shielding layer from the light sensitive layer is measured as the adhesive strength.

The oxygen shielding layer may further contains a surfactant or a matting agent. The oxygen shielding layer is formed by coating on the light sensitive layer a coating liquid in which the above oxygen shielding layer composition is dissolved in an appropriate coating solvent, and drying. The main solvent of the coating solvent is preferably water or an alcohol solvent such as methanol, ethanol, or isopropanol.

The thickness of the oxygen shielding layer is preferably 0.1 to 5.0 μm, and more preferably 0.5 to 3.0 μm.

The coating liquid for the photopolymerizable light sensitive layer in the invention preferably contains a polymerization inhibitor in addition to the compounds described above, in order to prevent undesired polymerization of the ethylenically unsaturated monomer during the manufacture or after storage of the presensitized planographic printing plate. Examples of the polymerization inhibitor include hydroquinone, p-methoxyphenol, di-t-butyl-p-cresol, pyrrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the photopolymerizable light sensitive layer composition. Further, in order to prevent polymerization induced by oxygen, a higher fatty acid such as behenic acid or a higher fatty acid derivative such as behenic amide may be added to the layer, or may be localized on the surface of the layer in the drying step after coating. The higher fatty acid or higher fatty acid derivative content is preferably 0.5 to 10% by weight based on the total solid content of the photopolymerizable light sensitive layer composition.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran".

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

When an argon laser (488 nm) or an SHG-YAG laser (532 nm) is used as a light source for exposure, violet pigment or blue pigment is preferably used in view of the above absorption wavelength relationship or image visibility after the exposure. Such pigment examples include Cobalt Blue, cerulean blue, alkali blue lake, Victria Blue lake, metal free phthalocyanine, Phthalocyanine Blue, Fast Sky Blue, Indanthrene Blue, indigo, dioxane violet, isoviolanthrone violet, Indanthrone Blue, and Indanthrene BC. Among these, Phthalocyanine Blue and dioxane violet are preferred.

The above composition can contain a surfactant as a coatability improving agent, as long as performance of the invention is not jeopardized. The surfactant is preferably a fluorine-contained surfactant.

Further, in order to improve the light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer composition.

(Coating)

The solvents used in the preparation of a coating liquid for the photopolymerizable light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The prepared coating liquid for the photopolymerizable light sensitive layer is coated on a support according to a conventional method, and dried to obtain a presensitized planographic printing plate. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated light sensitive layer cannot provide sufficient printing durability, while too a high drying temperature of the coated light sensitive layer results in marangoni and produces fog at non-image portions. The drying temperature is preferably from 60 to 160° C., more preferably from 80 to 140° C., and still more preferably from 90 to 120° C.

(Manufacturing Method of Planographic Printing Plate)

The manufacturing method of the planographic printing plate of the invention comprises imagewise exposing the presensitized planographic printing plate described above, and developing the exposed plate with a developer described later.

The light sources for the imagewise exposure of the presensitized planographic printing plate in the invention include, for example, a laser, an emission diode, a xenon flush lamp, a halogen lamp, a carbon arc light, a metal halide lamp, a tungsten lamp, a high pressure mercury lamp, and a non-electrode light source.

When the presensitized planographic printing plate is imagewise exposed, a mask material having a negative image pattern made of a light shielding material is put on the plate to be in close contact with the plate, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, argon laser, He-Ne gas laser, YAG laser or semi-conductor laser is preferably used. A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are more suitable for high density recording because they make it easy to enhance a precision of an optical system.

<Developer>

The presensitized planographic printing plate used in the invention is subjected to imagewise exposure to harden the exposed portions of the photopolymerizable light sensitive layer, and subjected to developing treatment employing an alkaline developer to remove unexposed portions of the layer, whereby an image is formed. The developer used in the developing treatment does not substantially contain an organic solvent.

The passage above, "the developer used in the developing treatment does not substantially contain an organic solvent" means that the developer does not contain an organic solvent at all, or the developer contains an organic solvent in an extremely slight amount. The above expression, "the developer contains an organic solvent in an extremely slight amount" means that the developer contains an organic solvent in an amount of not more than 2% by weight. Examples of the organic solvent added to the developer in an amount of not more than 2% by weight include an alcohol such as ethanol, n-propanol, isopropanol, n-butanol, isobutanol, benzyl alcohol, ethylene glycol, propylene glycol, 2-phenoxyethanol, or propylene glycol methyl ether.

The developer used in the invention is an aqueous solution with a pH of from 11.5 to less than 12.5.

The alkali agents for obtain the above pH include inorganic alkali agents such as sodium silicate, potassium silicate, ammonium silicate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide, and lithium hydroxide. These alkali agents may be used singly or as an admixture of two or more thereof. Among them, a mixture of potassium silicate and potassium hydroxide is preferred, wherein the potassium silicate content of the mixture is preferably 0.5 to 4.0% by weight in terms of $SiO_2$, and the potassium silicate is preferably added to the developer to give a pH of from 11.5 to less than 12.5.

The developer may contain organic alkali agents such as monomethylamine, dimethylamine, trimethylamine, monoethylamine, diethylamine, triethylamine, monoisopropylamine, diisopropylamine, butylamine, monoethanolamine, diethanolamine, triethanolamine, monoisopropanolamine, diisopropanolamine, ethyleneimine, ethylenediamine, and pyridine. The organic alkali agents herein referred to are different from the organic solvent described above, and the organic alkali agent content of the developer is preferably not more than 2% by weight.

The developer may optionally contain a surfactant such as an anionic surfactant, a nonionic surfactant, a cationic surfactant or an amphoteric surfactant. In the invention, the developing time is preferably from 10 to 40 seconds.

Thus, the imagewise exposed presensitized planographic printing plate is subjected to the developing treatment described above to obtain a planographic printing plate with an image. The resulting planographic printing plate is mounted on a press, and then printing is carried out. Examples of ink used at the printing include soybean oil-based ink. Examples of the soybean oil-based ink include TK HIGH ECO-SOY1, TK HIGH ECO-OS, TK ECOTWIN, CK WINECO-SOY3, and CK WINECO-SOY each produced by Toyo Ink Manufacturing Co., Ltd., and New Champion Naturalith 100 produced by Dainippon Ink Kagaku Kogyo Co., Ltd.

The soybean oil-based ink used in the invention contains soybean oil of from 1 to 20% by weight.

EXAMPLES

Next, synthetic examples, manufacturing examples of support, and examples will be shown below, but the present invention is not limited thereto. In the examples, "parts" represents "parts by weight", unless otherwise specified.

(Synthesis of Polymer Binder)
(Synthesis of Polymer Binder 1)

Twelve parts of methacrylic acid, 70 parts of methyl methacrylate, 8 parts of acrylonitrile, 10 parts of ethyl methacrylate, 500 parts of ethanol, and 3 parts of α,α'-azobisisobutylonitrile were put in a three neck flask under nitrogen atmosphere, and reacted under nitrogen atmosphere for 6 hours at 80° C. in an oil bath. Thus, polymer binder 1 was obtained. The weight average molecular weight of the polymer binder 1 was 45,000, measured according to GPC.

(Synthesis of Polymer Binder 2)

Twelve parts of methacrylic acid, 70 parts of methyl methacrylate, 8 parts of acrylonitrile, 10 parts of ethyl methacrylate, 500 parts of ethanol, and 3 parts of α,α'-azobisisobutylonitrile were put in a three neck flask under nitrogen atmosphere, and reacted under nitrogen atmosphere for 6 hours at 80° C. in an oil bath. After that, 3 parts of triethylammonium chloride and 2 parts of glycidyl methacrylate were added to the resulting reaction mixture, and further reacted for 3 hours. Thus, polymer binder 2 was obtained. The weight average molecular weight of the polymer binder 2 was 50,000, measured according to GPC. The glass transition temperature Tg of the polymer binder 2 was 85° C., measured according to DSC (differential thermal analysis).

(Preparation of Support)
(Preparation of Support 1)

A 0.24 mm thick aluminum plate (material 1050, quality H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 $A/dm^2$ in a 0.3 weight % nitric acid solution, desmut at 60° C. for 10 seconds in a 5% sodium hydroxide solution. The desmut aluminum plate was anodized at 25° C. for 1 minute at a current density of 10 $A/dm^2$ and at a voltage of 15 V in a 15% sulfuric acid solution. Thus, support 1 was obtained. The center line average surface roughness of the support 1 was 0.65 μm.

(Preparation of Support 2)

Support 2 was prepared in the same manner as in support 1, except that the electrolytically etching was carried out using an alternating current at 25° C. for 8 seconds at a current density of 80 $A/dm^2$ in a 1.15 weight % hydrochloric acid solution. The center line average surface roughness of the support 2 was 0.55 μm.

(Preparation of Support 3)

Support 3 was prepared in the same manner as in support 1, except that the electrolytically etching was carried out using an alternating current at 25° C. for 13 seconds at a current density of 80 A/dm² in a 1.15 weight % hydrochloric acid solution. The center line average surface roughness of the support 3 was 0.75 μm.

(Preparation of Support 4)

Support 4 was prepared in the same manner as in support 1, except that the electrolytically etching was carried out using an alternating current at 25° C. for 6 seconds at a current density of 80 A/dm² in a 1.15 weight % hydrochloric acid solution. The center line average surface roughness of the support 4 was 0.45 μm.

(Preparation of Support 5)

Support 5 was prepared in the same manner as in support 1, except that the electrolytically etching was carried out using an alternating current at 25° C. for 16 seconds at a current density of 80 A/dm² in a 1.15 weight % hydrochloric acid solution. The center line average surface roughness of the support 5 was 0.85 μm.

(Preparation of Support 6)

The support 1 was further subjected to sealing treatment at 90° C. in a 3% sodium silicate solution to obtain support 6.

(Coating of Subbing Layer on the Support)

The following subbing layer coating liquid was coated on each of the supports 1 through 6 using a wire bar, dried at 90° C. for one minute, and further heated at 110° C. for 3 minutes to give a subbing layer with a dry thickness of 0.1 g/m². Thus, subbed supports 1 through 6 were obtained.

(Subbing Layer Coating Liquid)

| | |
|---|---|
| γ-Methacryloxypropyltrimethoxysilane | 1 part |
| Methyl ethyl ketone | 80 parts |
| Cyclohexanone | 19 parts |

(Preparation of Presensitized Planographic Printing Plate)

The following photopolymerizable light sensitive layer coating liquid was coated on the subbed support using a wire bar, and dried at 95° C. for 1.5 minutes to give a light sensitive layer with a dry thickness of 1.4 g/m². After that, the following oxygen shielding layer coating liquid was coated on the light sensitive layer of the resulting plate using an applicator, and dried at 75° C. for 1.5 minutes to give an oxygen shielding layer with a dry thickness of 2.0 g/m². Thus, a presensitized planographic printing plate was prepared.

| (Photopolymerizable light sensitive layer coating liquid) | |
|---|---|
| Polymer binder (as shown in TABLE 1) | 35 parts |
| Sensitizing dye | amount shown in TABLE 1 |
| IRGACURE 784 | 4.0 parts |
| (produced by Ciba Specialty Chemicals Co., Ltd.) | |
| Addition polymerizable monomer | amount shown in TABLE 1 |
| having an ethylenic double bond | |
| Phthalocyanine pigment | 6.0 parts |
| (MHI 454 produced by Mikuni Sikisosha) | |
| 2-t-butyl-6-(3-t-butyl-2-hydroxy-5-methylbenzyl) | 0.5 parts |
| -4-methylphenyl acrylate | |
| (Sumirizer GS produced by Sumitomo 3M Co., Ltd.) | |
| Fluorine-contained surfactant | 0.5 parts |
| (FC-431 produced by Sumitomo 3M Co., Ltd.) | |
| Methyl ethyl ketone (bp. 79.6° C.) | 80 parts |
| Cyclopentanone (bp. 129° C.) | 820 parts |
| (Oxygen shielding layer coating liquid) | |
| Polyvinyl alcohol | amount shown in TABLE 1 |
| (GL-03 produced by Nippon Gosei Kagaku Co., Ltd.) | |
| Polyvinyl pyrrolidone | amount shown in TABLE 1 |
| (K-30 produced by Tokyo Kasei Co., Ltd.) | |
| Surfactant | 0.5 parts |
| (F142D produced by Dainippon Ink Kagaku Kogyo Co., Ltd.) | |
| Water | 900 parts |

TABLE 1

| No. | Support | Ra (μm) | Subbing layer | Polymer binder | Sensitizing dye (pts.) | Monomer (pts.) | | | | Oxygen shielding layer | | pH of Developer |
|---|---|---|---|---|---|---|---|---|---|---|---|---|
| | | | | | | 1 | 2 | 3 | 4 | PVA | PVP | |
| Ex. 1 | 6 | 0.65 | Present | 2 | dye 1: 2.0 dye 2: 2.0 | 20 | 10 | 20 | — | 90 | 10 | 12.3 |
| Ex. 2 | 1 | 0.65 | None | 2 | dye 1: 2.0 dye 2: 2.0 | — | 10 | 20 | 20 | 90 | 10 | 12.3 |
| Ex. 3 | 2 | 0.55 | None | 2 | dye 1: 2.0 dye 2: 2.0 | — | 10 | 20 | 20 | 90 | 10 | 12.3 |

TABLE 1-continued

| No. | Support | Ra (μm) | Subbing layer | Polymer binder | Sensitizing dye (pts.) | Monomer (pts.) 1 | 2 | 3 | 4 | Oxygen shielding layer PVA | PVP | pH of Developer |
|---|---|---|---|---|---|---|---|---|---|---|---|---|
| Ex. 4 | 3 | 0.75 | None | 2 | dye 1: 2.0 dye 2: 2.0 | — | 10 | 20 | 20 | 90 | 10 | 12.3 |
| Comp. Ex. 1 | 4 | 0.45 | None | 2 | dye 1: 2.0 dye 2: 2.0 | — | 10 | 20 | 20 | 90 | 10 | 12.3 |
| Comp. Ex. 2 | 5 | 0.85 | None | 2 | dye 1: 2.0 dye 2: 2.0 | — | 10 | 20 | 20 | 90 | 10 | 12.3 |
| Ex. 5 | 1 | 0.65 | None | 1 | dye 1: 2.0 dye 2: 2.0 | — | 10 | 20 | 20 | 90 | 10 | 11.6 |
| Ex. 6 | 1 | 0.65 | None | 1 | dye 1: 2.0 dye 2: 2.0 | — | 10 | 20 | 20 | 90 | 10 | 12.3 |
| Ex. 7 | 1 | 0.65 | None | 1 | dye 3: 2.0 dye 4: 2.0 | — | 10 | 20 | 20 | 90 | 10 | 12.3 |
| Comp. Ex. 3 | 1 | 0.65 | None | 1 | dye 1: 2.0 dye 2: 2.0 | — | 10 | 20 | 20 | 90 | 10 | 11.1 |
| Comp. Ex. 4 | 1 | 0.65 | None | 1 | dye 1: 2.0 dye 2: 2.0 | — | 10 | 20 | 20 | 90 | 10 | 12.9 |
| Comp. Ex. 5 | 1 | 0.65 | None | 1 | dye 1: 2.0 dye 2: 2.0 | — | 10 | 20 | 20 | 100 | None | 12.3 |

In the above Table, "Ex." represents Example, "Com. Ex." represents Comparative example, "pts" represents parts, "PVA" represents polyvinyl alcohol, and "PVP" represents polyvinyl pyrrolidone
Monomer: Addition polymerizable monomer having an ethylenic double bond
Monomer 1: EO modified tris(acryloxyethyl) isocyanuric acid (ARONIX M-315, produced by Toa Gosei Co., Ltd.)
Monomer 2: Polytetramethylene glycol diacrylate (PTMGA-250, produced by Kyoeisha Chemical Co., Ltd.)
Monomer 3: polyfunctional urethane acrylate (U-4HA, produced by Shin Nakamura Kagaku Kogyo Co., Ltd.)
Monomer 4: 2-methacryloyloxy ethyl acid phosphate (LIGHT-ESTER P-2M, produced by Kyoeisha Chemical Co., Ltd.)

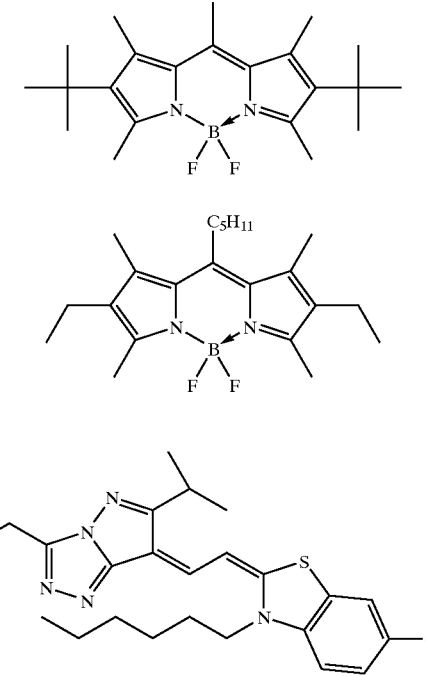

Dye 1

Dye 2

Dye 3

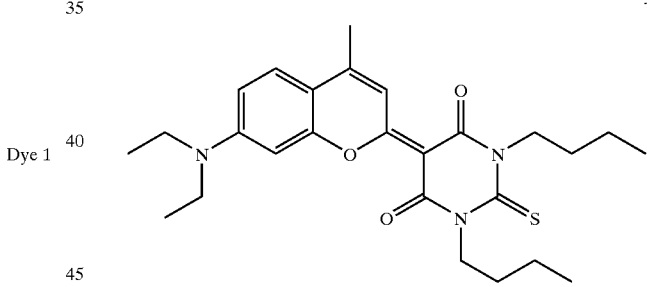

Dye 4

The photopolymerization type presensitized planographic printing plate obtained above was imagewise exposed at a resolving degree of 2540 dpi (dpi represents the dot numbers per 2.54 cm) employing a CTP exposure apparatus (Tigercat produced by ECRM Co., Ltd.) installed with a FD-YAG laser source. The exposed plate was developed employing a CTP automatic developing machine (PHW 23-V produced by Technicagraph Co., Ltd.). Herein, the developing machine comprised a pre-washing section for removing the oxygen shielding layer before development, a development section charged with developer having the following composition, a washing section for removing the developer remaining on the developed plate after development, and a gumming section charged with a gumming solution (a solution obtained by diluting GW-3, produced by Mitsubishi Chemical Co., Ltd., with water by a factor of 2) for protecting the surface of the developed plate. Thus, a planographic printing plate was obtained.

Developer Composition (Aqueous Solution Containing the Following Materials)

| | |
|---|---|
| Potassium silicate A (an aqueous potassium silicate solution containing 25.5–27.5% by weight of $SiO_2$ and 12.5–14.5% by weight of $K_2O$) | 8.0% by weight |
| PELEX NBL produced by Kao Co., Ltd. | 3.0% by weight |
| Potassium hydroxide | Amount giving pH as shown in Table 1. |

(Evaluation of Presensitized Planographic Printing Plate and Planographic Printing Plate)

The presensitized planographic printing plate obtained above was evaluated as follows.

<<Sensitivity>>

Exposure amount reproducing an image with a screen line number of 175 and a dot percentage of 50% with no reduction of the layer thickness at image portions was designated as the optimal exposure amount, and sensitivity was represented in terms of the optimal exposure amount. The less the optimal exposure amount is, the higher the sensitivity.

<<Developability After Accelerated Aging>>

The presensitized planographic printing plate was put a thermostat (TABAI PERFECT OVEN PV-230 produced by TABAI PEC CORP.), and stored at 55° C. and 20% RH for 5 days. The sulting plate was exposed and developed in the same manner above, and was evaluated for developability according to e following evaluation criteria:

5 The light sensitive layer at non-image portions was completely removed.
4 Slight light sensitive layer remained at parts of non-image portions.
3 Slight light sensitive layer remained over the whole of the non-image portions.
2 The light sensitive layer remained over the whole of the non-image portions.
1 The light sensitive layer at non-image portions was not removed at all.

<<Adhesive Strength Between the Oxygen Shielding Layer and the Light Sensitive Layer>>

An adhesive tape was adhered to the cut end of the presensitized planographic printing plate, and then peeled. This operation was repeated, and evaluated for adhesive strength of the oxygen shielding layer as follows.

5 The above operation was repeated ten times, but no peeling of the oxygen shielding layer was observed.
4 After the above operation was repeated ten times, the oxygen shielding layer peeled away.
3 After the above operation was repeated five times, the oxygen shielding layer peeled away.
2 After the above operation was repeated 2 times, the oxygen shielding layer was peeled away.
1 After the above operation was carried out only once, the oxygen shielding layer peeled away.

The planographic printing plate was evaluated as follows.

<<Soybean Oil-based Ink Receptivity at Image Portions of Planographic Printing Plate>>

The above obtained presensitized planographic printing plate was exposed through an original with a screen line number of 175 at an optimal exposure amount, and developed in the same manner as above to obtain a planographic printing plate. Employing the resulting printing plate, printing was carried out on a press (DAIYA1F-1 produced by Mitsubishi Jukogyo Co., Ltd.), wherein a coat paper, printing ink (soybean oil-based ink "Naturalist 100" produced by Dainippon Ink Kagaku Kogyo Co., Ltd.), and dampening water (SG-51, H solution produced by Tokyo Ink Co., Ltd., Concentration: 1.5%) were used. The number of prints printed from the beginning of the printing till when a print having an image with a normal ink density was obtained was counted. The less the number is, the better the ink receptivity.

<<Printing Durability of Planographic Printing Plate when Printing was Carried Out Employing Soybean Oil-based Ink>>

The above obtained presensitized planographic printing plate was exposed through an original with a screen line number of 175 at an optimal exposure amount, and developed in the same manner as above to obtain a planographic printing plate. Employing the resulting printing plate, printing was carried out on a press (DAIYA1F-1 produced by Mitsubishi Jukogyo Co., Ltd.), wherein a coat paper, printing ink (soybean oil-based ink "Naturalith 100" produced by Dainippon Ink Kagaku Kogyo Co., Ltd.), and dampening water (SG-51, H solution produced by Tokyo Ink Co., Ltd., Concentration: 1.5%) were used. The number of prints printed from the beginning of the printing till when dot area reduction at highlights of the image was observed was counted. The obtained number was evaluated as a measure of printing durability.

The results are shown in Table 2.

TABLE 2

| No. | Sensitivity ($\mu J/cm^2$) | Developability after accelerated aging | Adhesive strength of oxygen shielding layer | Ink receptivity (print number) | Printing durability (soybean oil-based ink) (Print number × 10000) |
|---|---|---|---|---|---|
| Example 1 | 75 | 5 | 5 | 12 | 20 |
| Example 2 | 70 | 5 | 5 | 12 | 22 |
| Example 3 | 65 | 5 | 5 | 12 | 16 |
| Example 4 | 75 | 5 | 5 | 12 | 20 |
| Comparative example 1 | 65 | 5 | 5 | 12 | 8 |
| Comparative example 2 | 120 | 3 | 5 | 19 | 20 |
| Example 5 | 75 | 5 | 5 | 11 | 20 |
| Example 6 | 80 | 5 | 5 | 12 | 20 |
| Example 7 | 100 | 5 | 5 | 12 | 18 |
| Comparative example 3 | 130 | 3 | 5 | 30 | 16 |
| Comparative example 4 | 220 | 5 | 5 | 58 | 6 |
| Comparative example 5 | 150 | 4 | 1 | 19 | 15 |

As is apparent from Table 2 above, inventive method can provide a planographic printing plate with high ink receptivity and high printing durability, imagewise exposing and developing a presensitized planographic printing plate with high sensitivity, high storage stability, and an oxygen shielding layer firmly adhered to the light sensitive layer with good adhesion.

[Effect of the Invention]

The invention can provide a method of developing a presensitized planographic printing plate with high sensitivity and high storage stability with a developer to obtain a planographic printing plate with high ink receptivity and high printing durability, wherein the presensitized planographic printing plate comprises a light sensitive layer and provided thereon, an oxygen shielding layer firmly adhered to the light sensitive layer with good adhesion.

What is claimed is:

1. A method of manufacturing a planographic printing plate, the method comprising the step of:

developing a presensitized planographic printing plate with a developer with a pH of from 11.5 to less than 12.5, which does not substantially contain an organic solvent, wherein the presensitized planographic printing plate comprises a support having a roughened hydrophilic surface with a center line average surface roughness Ra of from 0.5 to 0.8 μm, and provided thereon, a photopolymerizable light sensitive layer and an oxygen shielding layer in that order, the photopolymerizable light sensitive layer containing A) an addition polymerizable monomer having an ethylenic double bond, B) a photopolymerization initiator, C) a sensitizing dye, and D) a polymer binder, and the oxygen shielding layer containing E) polyvinyl alcohol and F) polyvinyl pyrrolidone.

2. The method of claim 1, wherein the developer is a developer containing no organic solvent or a developer containing an organic solvent in an amount of not more than 2% by weight.

3. The method of claim 1, wherein the presensitized planographic printing plate comprises a subbing layer containing a compound having a polyalkoxysilyl group between the support and the photopolymerizable light sensitive layer.

4. The method of claim 3, wherein the compound having a polyalkoxysilyl group is a silane coupling agent having a (meth)acryloyl group.

5. The method of claim 1, wherein the addition polymerizable monomer having an ethylenic double bond further has a phosphate bond in the molecule.

6. The method of claim 1, wherein the photopolymerization initiator is a titanocene compound.

7. The method of claim 1, wherein the sensitizing dye is a pyromethene dye.

8. The method of claim 1, wherein the polymer binder is a reaction product of a vinyl copolymer having a carboxyl group in the molecule with a compound having a (meth)acryloyl group and an epoxy group in the molecule.

9. The method of claim 1, wherein the polymer binder has an acid value of from 10 to 150.

10. The method of claim 1, wherein the planographic printing plate is a printing plate used when printing is carried out employing soybean oil-based ink.

* * * * *